(12) United States Patent
Staszewski et al.

(10) Patent No.: US 6,593,773 B2
(45) Date of Patent: Jul. 15, 2003

(54) POWER SAVING CIRCUITRY USING PREDICTIVE LOGIC

(75) Inventors: Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/967,275

(22) Filed: Sep. 28, 2001

(65) Prior Publication Data

US 2002/0158662 A1 Oct. 31, 2002

Related U.S. Application Data

(60) Provisional application No. 60/286,572, filed on Apr. 25, 2001, and provisional application No. 60/313,905, filed on Aug. 21, 2001.

(51) Int. Cl.[7] ............................. H03D 3/24; H03L 7/06
(52) U.S. Cl. ........................ 326/46; 327/12; 327/3; 327/158; 327/107
(58) Field of Search ................ 326/46, 93; 327/33, 327/271, 141, 144, 145, 12, 3, 158, 107; 377/24, 20

(56) References Cited

U.S. PATENT DOCUMENTS

| | | | |
|---|---|---|---|
| 5,128,624 A | * | 7/1992 | Hoshino et al. ............ 328/133 |
| 5,835,552 A | * | 11/1998 | Kusumoto et al. ............ 377/24 |
| 6,429,693 B1 | * | 8/2002 | Staszewski et al. ........... 327/12 |

* cited by examiner

*Primary Examiner*—Daniel Chang
(74) *Attorney, Agent, or Firm*—Ronald O. Neerings; Wade James Brady, III; Frederick J. Telecky, Jr.

(57) ABSTRACT

To conserve power in a circuit where a high-speed signal HSIG controls combinational logic (10), while a low-speed signal LCLK drives a logic/memory circuit (12) that samples the output of the combinational logic, predictive logic state machine (14) generates a clock, P_LCLK, which has an active level preceding the active edge of LCLK by a period sufficient to allow the combinational logic to reach the desired state prior to the active edge of LCLK and, preferably, allows for possible jitter in LCLK. Responsive to P_LCLK, the signal suspend circuitry (16) either passes HSIG or gates off HSIG. Further reductions in power can be accomplished by predicting which portions of the logic/memory circuit (12) will be used, and clocking those portions.

35 Claims, 4 Drawing Sheets

US 6,593,773 B2

POWER SAVING CIRCUITRY USING PREDICTIVE LOGIC

CROSS-REFERENCE TO RELATED APPLICATIONS

This application claims the benefit of the filing date of provisional applications U.S. Ser. No. 60/286,572, filed Apr. 25, 2001, entitled "Frequency Synthesizer Architecture of the Digital Radio Processor (v2.0)" to Staszewski et al and U.S. Ser. No. 60/313,905, filed Aug. 21, 2001, entitled "Power Saving Circuitry Using Predictive Logic" to Staszewski et al.

This application is related to U.S. Ser. No. 09/608,317, filed Jun. 30, 2000, entitled "Digital Fractional Phase Detector" to Staszewski et al, which is incorporated by reference herein.

STATEMENT OF FEDERALLY SPONSORED RESEARCH OR DEVELOPMENT

Not Applicable

BACKGROUND OF THE INVENTION

1. Technical Field

This invention relates in general to integrated circuits and, more particularly, to a method and apparatus for reducing power consumption in an integrated circuit for frequency synthesis.

2. Description of the Related Art

A great reduction of the transistor features in recently developed deep-submicron CMOS processes shifts the design paradigm towards more digitally-intensive techniques. In a monolithic implementation, the manufacturing cost of a design is measured not in terms of a number of devices used but rather in terms of the occupied silicon area, no matter what the actual circuit complexity.

Analog and RF circuits used in communication circuits, however, are not easily implemented in a deep-submicron CMOS process. For example, in Texas Instruments' CMOS process (C035) of 0.08 $\mu$m L-effective features a digital gate density of 150K equivalent (2-input NAND) gates per mm$^2$. An average-size inductor for an integrated LC oscillator occupies about 0.5 mm$^2$ of silicon area. A low-noise charge pump, or a low-distortion image-reject modulator, both good examples of classical RF transceiver components, occupy roughly about the same area, which could be traded for tens of thousands of digital gates.

Migrating to a digitally-intensive synthesizer architecture brings forth the following well-known advantages: (1) fast design turn-around cycle using automated CAD tools (VHDL or Verilog hardware-level description language, synthesis, auto-place and auto-route with timing-driven algorithms, parasitic backannotation and postlayout optimization), (2) much lower parameter variability than with analog circuits, (3) ease of testability, (4) lower silicon area and dissipated power that gets better with each CMOS technology advancement (also called a "process node") and (5) excellent chances of first-time silicon success. Commercial analog circuits usually require several design iterations to meet marketing requirements.

Sensible integration of diverse sections results in a number of advantages: (1) lower total silicon area. In a deep-submicron CMOS design, the silicon area is often bond-pad limited; consequently, it is beneficial to merge various functions on a single silicon die to maximize the core to bond-pad ratio, (2) lower component count and thus lower packaging cost, (3) power reduction—no need to drive large external inter-chip connections and (4) lower printed-circuit board (PCB) area, thus saving the precious "real estate."

While a digital implementation can reduce power consumption, it is still important for a digital design to be power efficient. In addition to environmental concerns over wasted energy resources, power efficiency is particularly important for battery-powered devices to maximize the time between battery replacement/recharging.

Therefore, a need has arisen for a method and apparatus for a power efficient digital circuit.

BRIEF SUMMARY OF THE INVENTION

In the present invention, a time-to-digital conversion is performed relative to a first signal and a second signal, wherein the first signal transitions between states rapidly with respect to the second signal. The first signal is passed to a string of logic devices during a time period sufficient to allow the first circuit to reach a desired state prior to an active edge of the second signal and is not passed during other time periods. A state associated with the string of logic devices is stored responsive to the active edge of a second signal.

The present invention provides a significant advantage over the prior art. Since the first signal is passed to the string of logic devices only during a time period where the active edge of the second signal may occur, the logic devices do not transition between states during periods where propagation of the first signal is unnecessary, thereby conserving power.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–9 of the drawings, like numerals being used for like elements of the various drawings.

Figure 1:
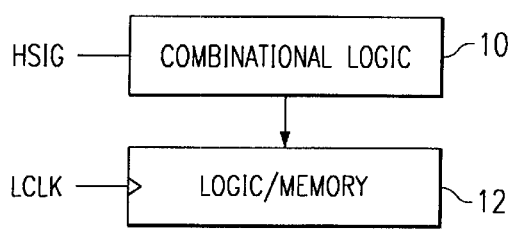
FIG. 1 illustrates a block diagram of a circuit with potential power waste.

FIG. 1 illustrates a circuit design that is especially useful for implementation in communication devices. Unfortunately, the circuit has limitations. Combinational logic 10 receives a high-speed signal HSIG (and possibly other signals as well). HSIG could be, for example, a high-speed clock, or other signal or combination of signals that have the possibility of changing logic levels in the combinational logic 10 frequency. Logic-memory circuit 12 performs an operation responsive to LCLK based on the current status of the combination logic 10. LCLK need not be a clock signal, however, its frequency of change should be small relative to HSIG. Logic/memory 12 could be, for example, some form of memory, such as registers, latches, flip-flops or addressable memory, or it could also be additional combination logic.

If HSIG is changing more rapidly than LCLK, and the function of combinational logic 10 is to provide information to memory logic 12, then there is a possibility that combinational logic 10 is consuming power because of transitions of the HSIG signal, even though the transitions will have no effect upon the eventual operation of logic/memory 12 upon an LCLK transitions. In other words, between active edges of LCLK, HSIG may be causing transitions in the combinational logic 10, even though these transitions will have no bearing on the function of logic/memory 12 on the next active edge of LCLK. Since the transitions in the combinational logic 10 consume significant amounts of power, transitions in this intermediate time period between active edges of LCLK can waste power.

Figure 2:
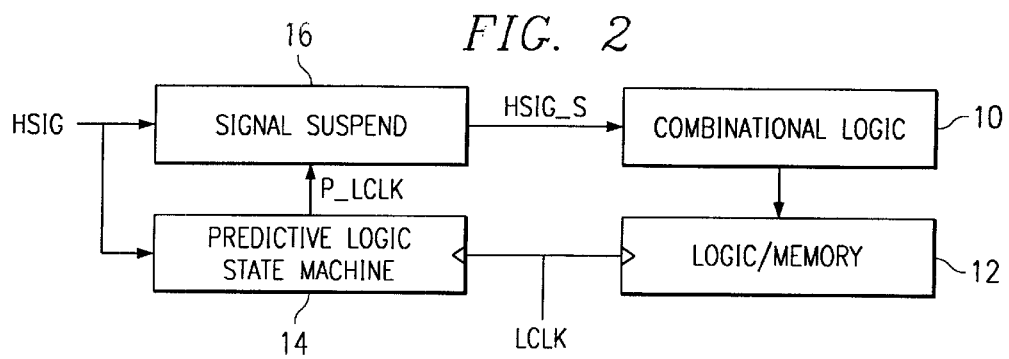
FIG. 2 illustrates a block diagram of an embodiment of the present invention that may prevent a large portion of the power wasted in circuits such as that shown in FIG. 1.

FIG. 2 illustrates an embodiment of the present invention that may prevent a large portion of the power wasted in circuits as described above. FIG. 2 is similar to FIG. 1, except a signal suspend circuit 16 is interposed between HSIG and the combinational logic 10 and predictive logic state machine 14 is coupled to HSIG, LCLK and the signal suspend circuit 16.

In operation, predictive logic state machine 14 generates a clock, P_LCLK, which has an active edge preceding the active edge of LCLK by a period sufficient to allow the combinational logic to reach the desired state prior to the active edge of LCLK and, preferably, allows for possible jitter in LCLK. Responsive to P_LCLK, the signal suspend circuitry 16 either passes HSIG (HSIG_S=HSIG) or holds HSIG_S at a static level.

Figure 3:
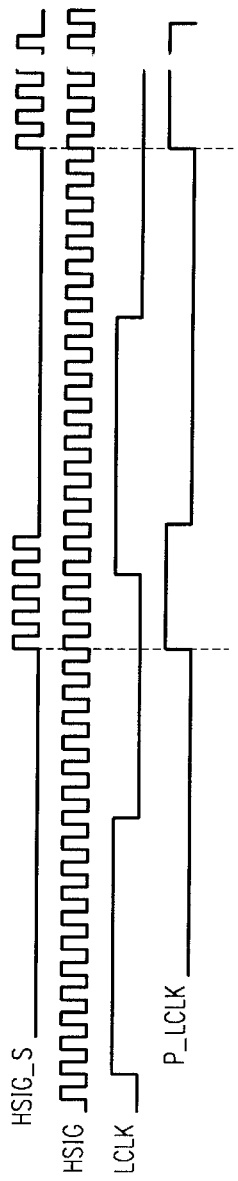
FIG. 3 illustrates a timing diagram of an example of a predictive clock signal.

FIG. 3 illustrates an example where P_LCLK is generated three HSIG clock cycles prior to an active edge of LCLK to allow the combinational logic 10 to complete its function prior to LCLK initiating action by the logic/memory 12. While in FIG. 3, LCLK is shown as an integer division of HSIG, a periodic signal can be generated even if LCLK is a non-integer division of HSIG, or if LCLK is non-period, so long as LCLK is predictable in some manner.

Figure 4:
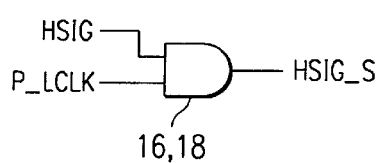
FIG. 4 illustrates a schematic view of a signal suspend circuit.

FIG. 4 illustrates an embodiment for the signal suspend circuitry 16. An AND gate 18 has inputs coupled to HSIG and P_LCLK. The output of AND gate 18 is HSIG_S. When P_LCLK is at a logical low, HSIG_S will be forced to a logical low, regardless of the value of HSIG. When P_LCLK is at a logical high, HSIG_S will vary according to HSIG (with a slight delay for propagation through AND gate 18). If HSIG is a multiple bit signal, multiple AND gates 18 can be used for each bit of HSIG, with the other input coupled to P_LCLK. Other logic configurations could be used to accomplish the same function, as would be known to one skilled in the art.

Figure 5:
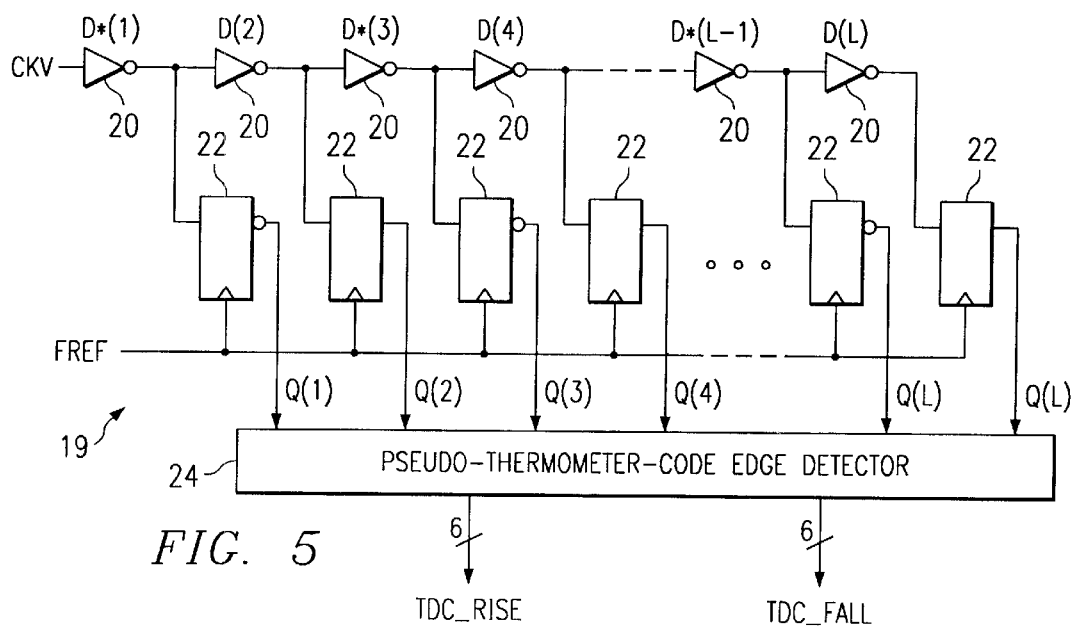
FIG. 5 illustrates a schematic view of a TDC (time-to-digital converter) portion of a fractional phase detector circuit.

FIG. 5 illustrates a time-to-digital converter (TDC) 19 for measuring a fractional delay between a high speed clock (CKV) and slower clock FREF. Such a circuit may be used, for example, in a digital PLL for calculating phase error measurements. In one application, CKV could be 2.4 GHz, while FREF, the output of a crystal oscillator, could be 13 MHz. Hence, there ratio of CKV/FREF is approximately 184.6.

In FIG. 5, the CKV signal passes through a string of inverters 20. Each inverter (or other logic device) 20 features a known time delay, for example, approximately 20 psec using Texas Instruments' (C035) of 0.08 µm L-effective CMOS process. On the active (rising) edge of FREF, a corresponding set of registers 22 capture the timing state output (D(1) . . . D(L)) of each inverter. The output of every other register 22 is inverted to compensate for the inversion by each inverter 20. The outputs (Q(1) . . . Q(L)) of the registers 22 are received by a pseudo-thermometer-code edge detector 24, which outputs the location of a rising edge and a falling edge relative to FREF.

Figure 6:
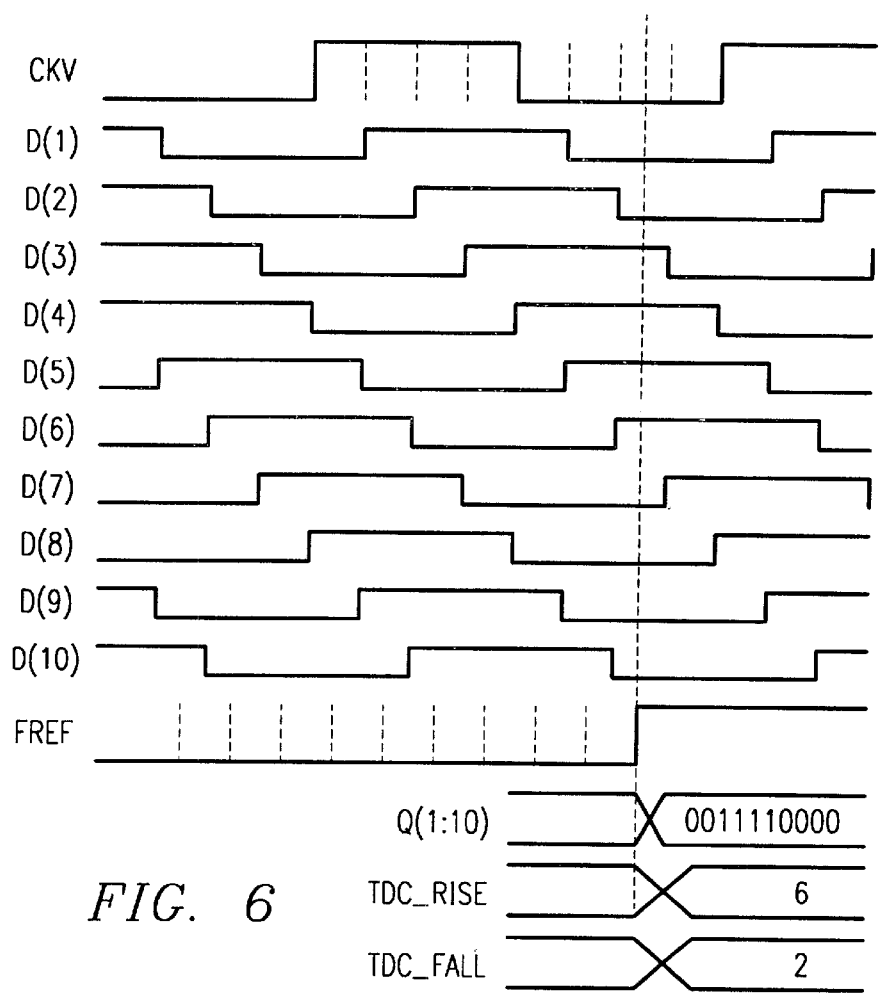
FIG. 6 illustrates a timing diagram associated with the TDC of FIG. 5.

The operation of the circuit is shown in FIG. 6, which shows the Q(1 . . . L) values (L=10 in the illustrated embodiment) at the active edge of FREF. In the illustrated example, the falling edge of CKV that immediately precedes FREF is displaced by two inverter delays, while the rising edge of CKV that immediately precedes FREF is displaced by six inverter delays.

Additional detail on the operation of time-to-digital converter 19 can be found in U.S. Ser. No. 09/608,317, filed Jun. 30, 2000, entitled "Digital Fractional Phase Detector" to Staszewski et al, which is incorporated by reference herein.

A problem with the circuit of FIG. 5 is that there are two transitions per CKV clock that propagates through the inverter string, and there are approximately 184 CKV clocks per FREF clock. In the example above, using a ten inverter string, there are approximately 3700 unused inversions per FREF clock. This amounts to $3700*13 \times 10^6 = 4.8 \times 10^{10}$ unused inversions per second. With smaller feature sizes, and therefore smaller propagation times through the inverters 20, this waste would be even greater since the inverter strings would be longer.

Figure 7:
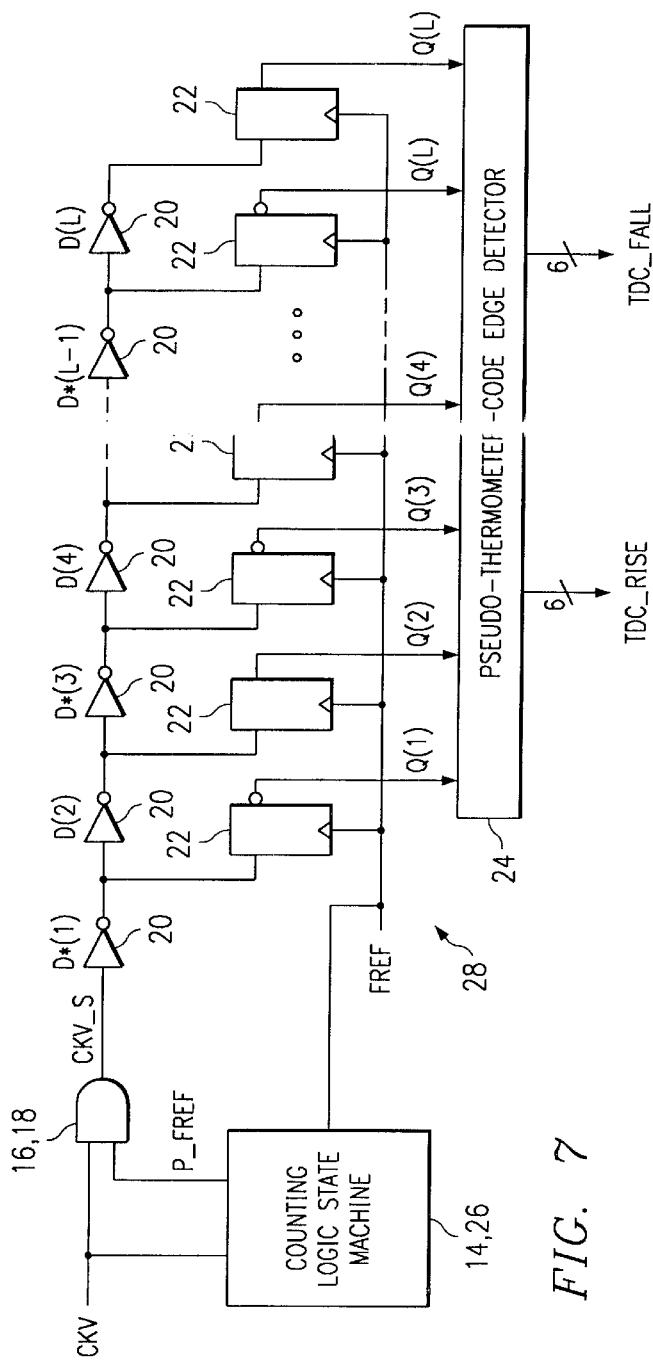
FIG. 7 illustrates an embodiment of a TDC for implementing power saving techniques on the circuit of FIG. 5.

FIG. 7 illustrates an embodiment of a TDC 28 with power saving circuitry to reduce unnecessary inversions. As shown in FIG. 7, an AND gate 18 is used to hold CKV_S at a logical low while P_FREF, the signal that predicts the active edge of FREF, is at a logical low. Counting logic 26 counts CKV signals to predict the next active edge of FREF. In the example given above, there will be approximately 184 CKV clocks per FREF edge and the signal will need between one and two CKV clocks to propagate through the string of inverters 20. The amount of power used by the counting logic could be decreased by using an edge division circuit on CKV.

Figure 8A:
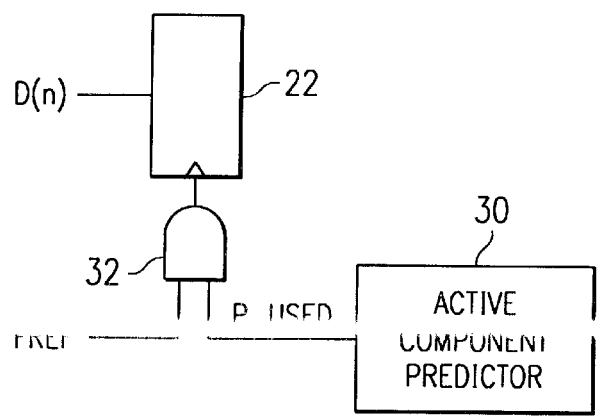
FIGS. 8a–b illustrate an additional embodiment and flow chart for implementing power saving techniques on the circuit of FIG. 5.

In FIG. 8a, an embodiment is shown which can result in even greater power savings. In this embodiment, only the registers within a predicted range are enabled. For any fractional phase difference between FREF and CKV in the example above, there will be a predictable, repeating pattern of which registers span the rising and falling edges of CKV at the active edge of FREF. In FIG. 8, an active component predictor 30 determines a span of components (i.e., registers 22) that are likely to be used in predicting the rising and falling edges of CKV. The prediction could be based, for example, on a fractional-N value of a frequency division ratio of a frequency synthesizer, combined with the observed prior transition locations. For each register that will possibly be used in the detection, P_USED is high; P_USED to the other registers 22 will be set to a logical low. For each register 22, P_USED is input to an AND gate 32 with FREF and the output of AND gate 32 is used to clock the register 22. Accordingly, many of the registers will not be clocked, thereby saving the transition power and conserving energy.

The selected region should be large enough to ensure a good "hit" probability. It should be noted that a miss is not a serious occurrence; it means that no phase information could be used for that particular compare event. In this case, the next compare event could engage additional registers 22, or all registers 22, just to guarantee no consecutive misses.

Figure 8B:
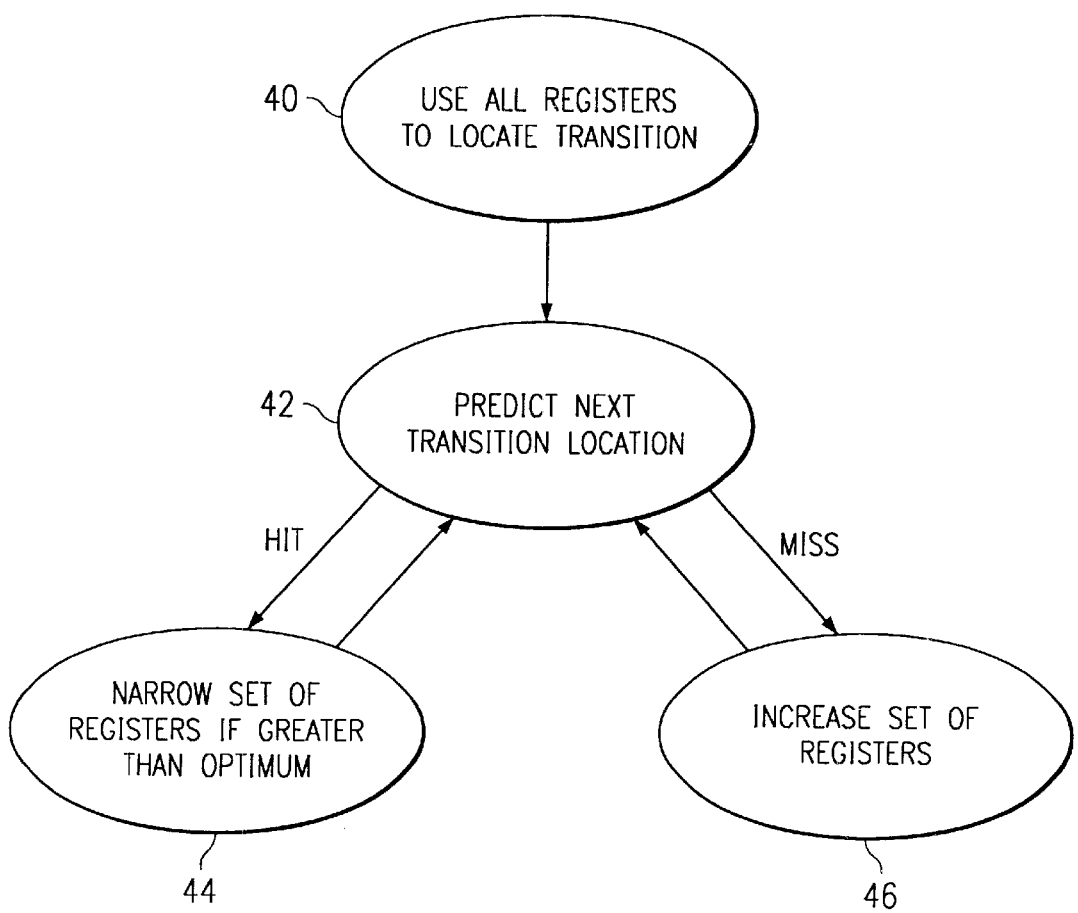

FIG. 8b illustrates a strategy for using registers in a predicted range to locate the transition of CKV as propagated through the string of inverters 20. In initial state 40, all registers 24 are enabled to store the state of respective inverters 22 responsive to an FREF transition. In this case, it is guaranteed that a transition will be found between two of the registers 24. The location of the detected transition and the known fractional-N value of the frequency division ratio of CKV to FREF can be used to predict the location of the next transition in state 42. So long as the previous prediction was a "hit", the number of registers 24 in the predicted set may be narrowed gradually until an optimum number is reached in state 44. The minimum number of registers 24 that could be used to observe the transition would be two; however to avoid excessive misses due to jitter and other occurrences, the selected region should be somewhat larger, depending upon the application and operating conditions. If a miss occurs, then the number of registers 24 is increased in state 46 until a hit occurs. The "optimum" number of registers used may be dynamically configured during operation of the device to allow operation within a desired hit/miss ratio.

Figure 9:
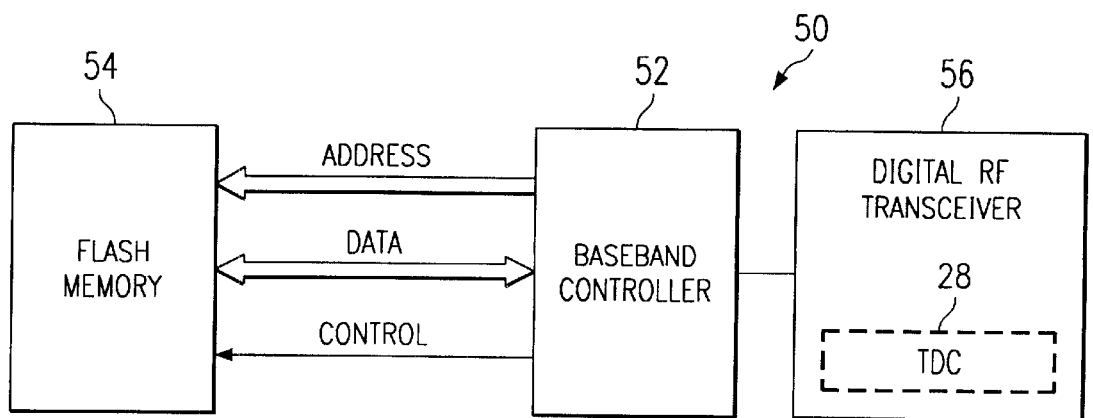
FIG. 9 illustrates a mobile communications device using a TDC with power saving features.

FIG. 9 illustrates a preferred embodiment of a telecommunication device 50 using the time-to-digital converter 28. A baseband controller 52 is coupled to a memory 54 and a digital RF transceiver 56, which includes the time-to-digital converter 28 described above. Because the time-to-digital converter 28 eliminates large numbers of logic inversions, it uses substantially less power than other devices.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A method of performing a time-to-digital conversion between edges of a first signal and a second signal, wherein said first signal transitions between states rapidly with respect to said second signal, comprising the steps of:
   passing said first signal to a string of logic devices during a time period sufficient to allow the first circuit to reach a desired state prior to an active edge of the second signal and not passing the first signal to the string of logic devices during other time periods;
   storing a state associated with said string of logic devices responsive to the active edge of the second signal.

2. The method of claim 1 wherein the first signal is a high frequency clock signal.

3. The method of claim 2 wherein said second signal is a clock signal of lower frequency than said first signal.

4. The method of claim 1 wherein said passing step comprises the step of passing said first signal to a string of inverters during predetermined time periods where the active edge of said second signal may occur.

5. The method of claim 1 wherein said storing step comprises the step of storing the state in a plurality of storage devices coupled to the outputs of said logic devices at the active edge of said second signal.

6. The method of claim 5 wherein said storing step comprises the step of storing the outputs of selected ionic devices in a set of respective storage devices at the active edge of said second signal.

7. The method of claim 1 and further comprising the step of predicting a time period within which a next occurrence of an active edge of said second signal will occur.

8. A method of performing a time-to-digital conversion between edges of a first signal and a second signal, wherein said first signal transitions between states rapidly with respect to said second signal, comprising the steps of:
   passing said first signal to a string of logic devices during a time period sufficient to allow the string logic devices to reach the desired state prior to an active edge of the second signal and not passing the first signal to the string of logic devices during other time periods; and
   storing a state, associated with said string of selected logic devices responsive to the active edge of the second signal, in a set of respective storage devices coupled to outputs of said logic devices, at the active edge of said second signal, said set of respective storage devices being selected based on a prediction of a propagation of an edge of said first signal through said string of logic devices at the active edge of said second signal.

9. A time-to-digital converter, comprising:
   circuitry for receiving a first signal;
   circuitry for receiving a second signal, wherein said first signal transitions between states rapidly with respect to said second signal;
   a string of logic devices responsive to state transitions of said first signal;
   circuitry for determining a time difference between one or more edges of said first signal relative to an active edge of said second signal responsive to a state associated with said string of logic devices at the active edge of a second signal; and
   circuitry for preventing state transitions of said first signal causing transitions in said string of logic devices during periods between active edges of said second signal.

10. The time-to-digital converter of claim 9 wherein said first signal is a high frequency clock signal.

11. The time-to-digital converter of claim 10 wherein said second signal is a clock signal of lower frequency than said first signal.

12. The time-to-digital converter of claim 9 wherein said string of logic devices comprises a string of inverters.

13. The time-to-digital converter of claim 9 wherein said circuitry for determining a time difference includes a plurality of storage devices coupled to the outputs of said logic devices for storing the outputs of said logic devices at an active edge of said second signal.

14. The time-to-digital converter of claim 13 wherein a set of said storage devices store the output of respective logic devices at the active edge of said second signal.

15. The time-to-digital converter of claim 14 wherein said circuitry for determining a time difference further includes circuitry for selecting said set of storage devices based on a prediction of a propagation of an edge of said first signal through said string of logic devices at the active edge of said second signal.

16. A time-to-digital converter, comprising:
   circuitry for receiving a first signal;
   circuitry for receiving a second signal, wherein said first signal transitions between states rapidly with respect to said second signal;

a string of logic devices responsive to state transitions of said first signal;

circuitry for determining a time difference between one or more edges of said first signal relative to an active edge of said second signal responsive to a state associated with said string of logic devices at the active edge of a second signal; and circuitry for preventing state transitions of said first signal causing transitions in said string of logic devices during periods between active edges of said second signal and for passing said first signal to said second signal responsive to said time period.

17. The time-to-digital converter of claim 16 wherein said circuitry for preventing state transitions further comprises circuitry for passing said first signal to said second signal responsive to said time period.

18. A method of conserving energy in a circuit comprising a first circuit of combination logic and a second circuit, wherein said first circuit is responsive to a first signal and said second circuit is responsive to a state of said first circuit at an active edge of the second signal, wherein said first signal transitions between states rapidly with respect to said second signal, comprising the steps of:

passing the first signal to the first circuit during a time period sufficient to allow the first circuit to reach a desired state prior to the active edge of the second signal and not passing the first signal to the first circuit during other time periods; and using state information from said first circuit in said second circuit responsive to the active edge of the second signal.

19. A method of conserving energy in a circuit comprising a first circuit of combination logic and a second circuit, wherein said first circuit is responsive to a first signal and second circuit is responsive to a state of said first circuit at an active edge of the second signal, wherein said first signal transition between states rapidly with respect to said second signal, comprising the steps of:

passing the first signal to the first circuit during a time period sufficient to allow the first circuit to reach a desired state prior to the active edge of the second signal and not passing the first signal to the first circuit during other time periods;

using state information from said first circuit in said second circuit responsive to the active edge of the second signal; and predicting which portions of said second circuit will be used.

20. A method of performing a time-to-digital conversion between edges of a first signal and a second signal, wherein said first signal transitions between states rapidly with respect to said second signal, comprising the steps of:

passing said first signal to a string of logic devices;

predicting a location of a transition of said first signal as propagated through said string of logic devices;

storing a state associated with a predetermined set of said string of logic devices around said predicted location responsive to the active edge of the second signal.

21. The method of claim 20 wherein the number of logic devices in said predetermined set is increased if a transition is not observed.

22. The method of claim 20 wherein the number of logic devices in said predetermined set is decreased if a transition is observed and more than a predetermined optimum number of logic devices are in said set.

23. The method of claim 20 wherein said predicting step comprises the step of using a fractional-N value of a frequency division ratio between said first signal and said second signal.

24. The method of claim 23 wherein said predicting step further comprises the step of predicting a location based on the fractional-N value and a previously detected transition location.

25. Circuitry for performing a time-to-digital conversion between edges of a first signal and a second signal, wherein said first signal transitions between states rapidly with respect to said second signal, comprising:

a string of logic devices through which a first signal is propagated; circuitry predicting a location of a transition of said first signal as propagated through said string of logic devices;

storage circuits for storing output states of respective logic devices; and circuitry for enabling a predetermined set of said storage circuits associated with logic devices around said predicted location responsive to the active edge of the second signal.

26. The circuitry of claim 25 wherein the number of storage circuits in said predetermined set is increased if a transition is not observed.

27. The circuitry of claim 25 wherein the number of storage circuits in said predetermined set is decreased if a transition is observed and more than a predetermined optimum number of storage circuits are in said set.

28. The circuitry of claim 25 wherein said predicting circuitry comprises circuitry for calculating a fractional-N value of a frequency division ratio between said first signal and said second signal.

29. The circuitry of claim 28 wherein said predicting circuitry further comprises circuitry for predicting a location based on the fractional-N value and a previously detected transition location.

30. A method, comprising the steps of:

performing a time-to-digital conversion between edges of a first signal and a second signal, wherein said first signal transitions between states rapidly with respect to said second signal; and passing said first signal to a string of logic devices in a circuit during a time period sufficient to allow the circuit to each a desired state prior to an active edge of the second signal and not passing the first signal to the string of logic devices during other time periods.

31. The method of claim 30, further comprising the step of storing a state associated with said string of logic devices responsive to the active edge of the second signal.

32. A method, comprising the steps of:

performing a time-to-digital conversion between edges of a first signal and a second signal, wherein said first signal transition between states rapidly with respect to said second signal;

passing said first signal to a string of logic devices in a circuit during a time period sufficient to allow the circuit to reach a desired state prior to an active edge of second signal and not passing the first signal to the string of logic devices during other time period and predicting a time period within which a next occurrence of an active edge of said second signal will occur.

33. The method of claim 30, wherein said first signal is a high frequency clock signal and said second signal is a clock signal flower frequency than said first signal.

34. A telecommunication device, comprising:

a baseband controller; and a transceiver coupled to d baseband controller, said transceiver further comprising circuitry for performing a time-to-digital conversion between edges of a first signal and a second signal, wherein said first signal transitions between states rapidly with respect to said second signal, comprising:
- a string of logic devices through which a first signal is propagated;
- circuitry predicting location of a transition of said first signal as propagated through said string of logic devices;
- storage circuits for string output states of respective logic devices; and
- circuitry for enabling a predetermined set of said storage circuits associated with logic devices around said predicted location responsive to the active edge of the second signal.

35. A telecommunication device, comprising:

a baseband controller; an a transceiver coupled to said baseband controller, said transceiver further comprising a time-to-digital converter, comprising:
- circuitry for receiving a first signal;
- circuitry for receiving a second signal, wherein said first signal transitions between states rapidly with respect to said second signal;
- a string of logic devices responsive to state transitions of said first signal;
- circuitry for determining a time difference between one or more edges of said first signal relative to an active edge of said second signal responsive to a state associated with said string of logic devices at the active edge of a second signal; and
- circuitry for preventing state transitions of said first signal causing transitions in said string of logic devices during periods between active edges of said second signal.

* * * * *